(12) United States Patent
Lam

(10) Patent No.: US 6,701,489 B1
(45) Date of Patent: Mar. 2, 2004

(54) METHOD AND APPARATUS FOR CHANGING REGISTER IMPLEMENTATION WITHOUT CODE CHANGE

(75) Inventor: Ian Lam, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/306,458

(22) Filed: May 7, 1999

(51) Int. Cl.[7] .............................................. G06F 17/50
(52) U.S. Cl. ................................................. 716/4; 716/5
(58) Field of Search ...................................... 716/1–18

(56) References Cited

U.S. PATENT DOCUMENTS

| | | | | |
|---|---|---|---|---|
| 5,515,376 A | | 5/1996 | Murthy et al. ............ 370/85.13 |
| 5,671,351 A | * | 9/1997 | Wild et al. ............. 395/183.14 |
| 5,923,867 A | * | 7/1999 | Hand .......................... 395/500 |
| 6,077,304 A | * | 6/2000 | Kasuya ........................ 703/14 |
| 6,233,724 B1 | * | 5/2001 | LaBerge ...................... 716/18 |
| 6,324,672 B1 | * | 11/2001 | Lawman et al. ................ 716/1 |
| 6,427,223 B1 | * | 7/2002 | Kim et al. ..................... 716/4 |

* cited by examiner

Primary Examiner—Vuthe Siek (57) ABSTRACT

A network switch configured for switching data packets across multiple ports uses numerous digital registers to process signals in support of the switch's functionalities. The design parameters associated with these registers are readily modifiable by storing these parameters in a central storage system. These design parameters are automatically read into the source code of a hardware description language, whereby the values and definitions of the registers are modified without altering the source code. Accordingly, any source code requiring updated bit definition and default values is automatically initialized without concern over design mismatch.

20 Claims, 8 Drawing Sheets

METHOD AND APPARATUS FOR CHANGING REGISTER IMPLEMENTATION WITHOUT CODE CHANGE

BACKGROUND OF THE INVENTION

1. Technical Field

The present invention relates to data communication networking devices, more particularly, to modifying the digital registers associated with the different functions of a network switch without changing the source code.

2. Background Art

In computer networks, a plurality of network stations are interconnected via a communications medium. For example, Ethernet is a commonly used local area network scheme in which multiple stations are connected to a single shared serial data path. These stations often communicate with a switch located between the shared data path and the stations connected to that path. Typically, the switch controls the communication of data packets on the network.

The design of such a complex switch entails testing and managing a multitude of components, using a variety of design tools. Among the components that are vital to the switch's operation are its internal registers, which are used to store and process various digital signals. A bit definition table defines each of the bits within a register as welt as predesignated default values. In a conventional design approach, the bit definition table is modified (i.e., updated) and utilized by a number of switch design teams (e.g., hardware design team and test and evaluation team). For example, the hardware design team relies on the bit definition table to produce a schematic of the actual components to implement the registers. The bit definition table is also needed by a test and evaluation team to develop test cases for ensuring the proper operation of the registers within the switch.

Figure 5:
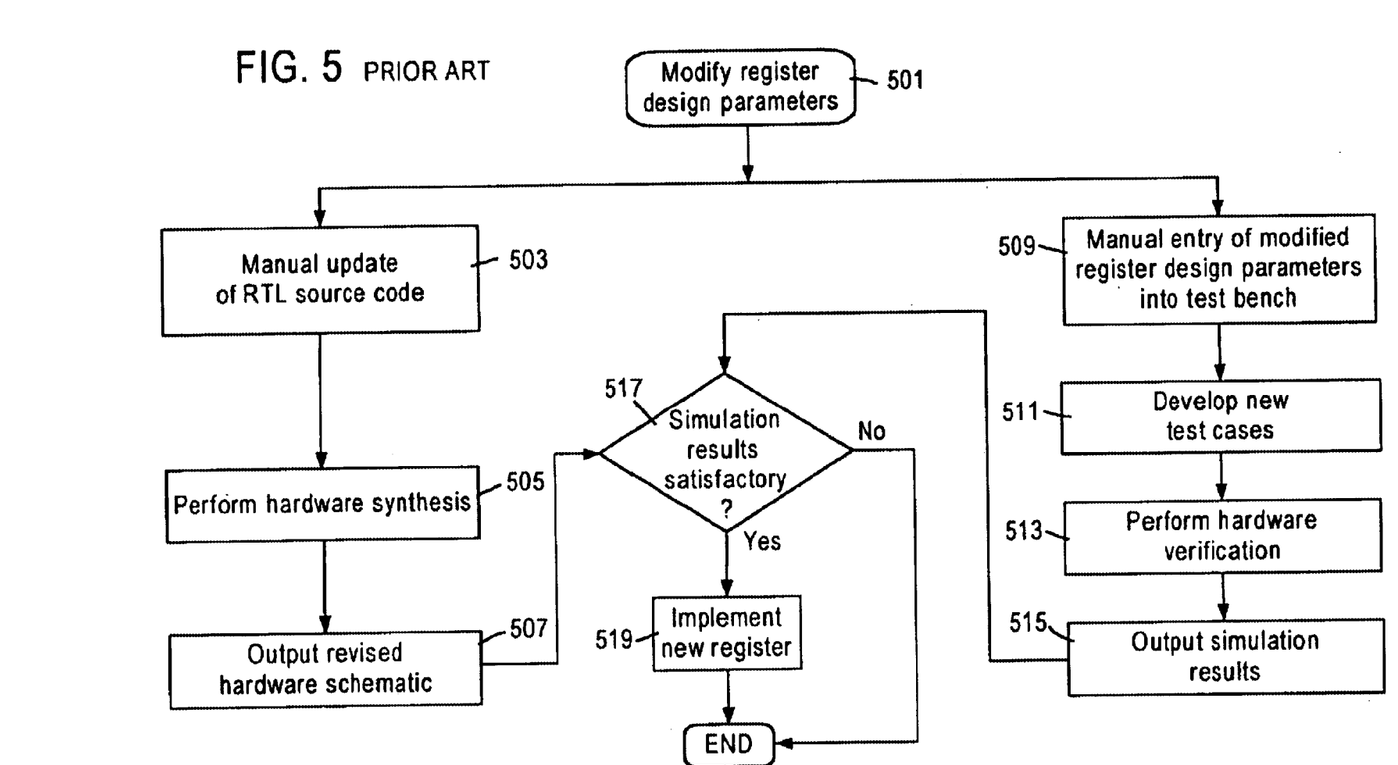
FIG. 5 is a flow diagram illustrating a conventional method of implementing digital register design parameter changes.

Typically, the design parameters of the digital registers are maintained separately and updated in an ad hoc fashion by the respective design teams. One conventional approach is shown in FIG. 5, which is a flow diagram of the design process involving a hardware design team and a test and evaluation team. In this exemplary process, it is assumed that the hardware design team in charge of a source code compiler, which synthesizes the hardware components of the multiport switch, seeks to change a register design parameter (step 501). In step 503, the hardware design team manually enters the new design parameter into the RTL (Register Transfer Level) code, which is processed by the source code compiler. Next, the source code compiler, in step 505, performs hardware synthesis of the source code; in this step, the source code is converted by the source code compiler into a hardware schematic (step 507).

Concurrently, the test and evaluation team also utilizes the modified design parameters, which is typically captured in a technical document. The test and evaluation team then manually enters the modified design parameter into the test bench, per step 509. The modified register design is used, as in step 511, to develop new test cases, which seek to test all the functions of the corresponding digital registers in an operation mode within the multiport switch. The next step 513 involves the test and evaluation team performing hardware verification of the digital registers. In turn, the test bench runs a series of simulations and outputs the simulation results per step 515. In step 517, the simulation results are examined to determine whether they are satisfactory; that is, the modified digital registers are operating within the multiport switch according to pre-established design criteria. In the event that the simulation results fall outside the established criteria, the modified digital registers are not implemented. However, if the simulation results are satisfactory, the digital registers as modified are implemented per step 519.

As illustrated in FIG. 5, for complex systems such as a network switch, numerous design teams (in this case, two design teams) work cooperatively to develop and test the switch. As a result, when one design team modifies design parameters, the other teams may not be aware of the changes until after the development efforts have occurred. That is, design mismatch due to version or interpretation errors is problematic. Another concern is that each design team must manually update source code variables or test bench inputs with the modified design parameters, thereby increasing the chances of coding errors. This also increases development time and costs.

SUMMARY OF THE INVENTION

There exists a need for a centrally storing and maintaining the design parameters of the digital registers to coordinate the updating of the implementation of the registers to avoid design mismatch. There is also a need for automatically modifying the register design parameters to eliminate coding errors to improve the efficiency of the design process.

These and other needs are met by the present invention, where design parameters associated with the digital registers of the network switch are maintained and stored in a central storage medium. These design parameters are automatically read into the source code, whereby the values and definitions of the registers are modified without altering the source code.

One aspect of the present invention provides a method for modifying the design of a digital register in a network switch. The method comprises modifying the design parameters associated with the digital register. The design parameters includes bit definition and bit default values. The method also includes centrally storing the modified design parameters in a central database and retrieving the modified design parameters from the central database into a source code that specifies functionality of the digital register within the multiport switch to initialize and define corresponding code variables within the source code. Hardware synthesis is performed based upon the modified design parameters. The method further comprises performing hardware verification based upon the modified design parameters. Lastly, the modified digital register is implemented in the network switch. Under this arrangement, the source code pertaining to the registers does not need to be modified, thereby advantageously reducing development time.

According to another aspect of the invention, a system for modifying the design of digital registers of a network switch comprises a centralized data storage system for storing and updating a register table that comprises a plurality of entries associated with the digital registers. Each of the register table entries includes bit definition and bit default values corresponding to each of the digital registers. A source code compiler has hardware modeling capability configured for importing entries from the centralized data storage system and initializing and defining corresponding code variables, and outputting a hardware schematic diagram of the digital register. A testing device is configured for concurrently testing operation and functionality of the digital registers based upon the register table entries. Accordingly, the source code can be automatically updated; thus, reducing the possibility of coding errors due to manual updates.

In yet another aspect of the invention, a system for modifying design of digital registers of a network switch comprises a central database for storing design parameters associated with the digital registers. A source code compiler retrieves the design parameters and utilizes the design parameters in a first procedure. In addition, a testing device retrieves the design parameters and utilizes the design parameters in a second procedure. This system provides for an efficient way to modify the design parameters of digital registers within a network switch and to reduce data entry errors.

Additional advantages and novel features of the invention will be set forth in part in the description which follows, and in part may become apparent to those skilled in the art upon examination of the following or may be learned by practice of the invention. The advantages of the invention may be realized and attained by means of the instrumentalities and combinations particularly pointed out in the appended claims.

DETAILED DESCRIPTION OF ILLUSTRATIVE EMBODIMENTS

The present invention will be described with the example of a switch operating in a packet switched network, such as an Ethernet (IEEE 802.3) network. It will become apparent, however, that the present invention is also applicable to other packet switched systems, as described in detail below, as well as to other types of systems in general.

Switch Architecture Overview

Figure 1:
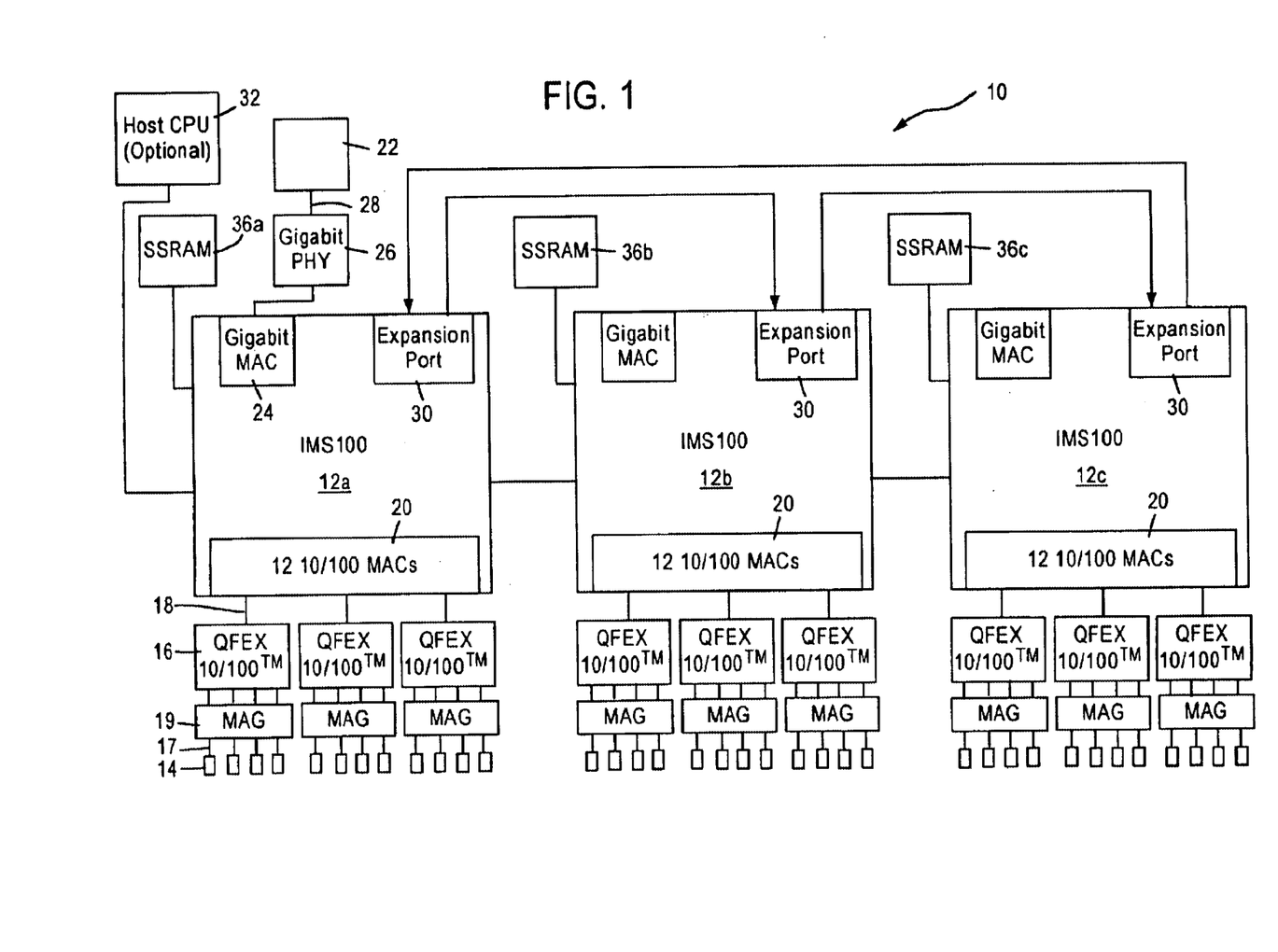
FIG. 1 is a block diagram of a packet switched network including a multiple port switch.

FIG. 1 is a block diagram of an exemplary system in which the present invention may be advantageously employed. The exemplary system 10 is a packet switched network, such as an Ethernet (IEEE 802.3) network. The packet switched network includes integrated multiport switches (IMS) 12 that enable communication of data packets between network stations. The network may include network stations having different configurations, for example twelve (12) 10 megabit per second (Mb/s) or 100 Mb/s network stations 14 (hereinafter 10/100 Mb/s) that send and receive data at a network data rate of 10 Mb/s or 100 Mb/s, and a 1000 Mb/s (i.e., 1 Gb/s) network node 22 that sends and receives data packets at a network speed of 1 Gb/s. The gigabit node 22 may be a server, or a gateway to a high-speed backbone network. Hence, the multiport switches 12 selectively forward data packets received from the network nodes 14 or 22 to the appropriate destination based upon Ethernet protocol.

Each multiport switch 12 includes a media access control (MAC) module 20 that transmits and receives data packets to and from 10/100 Mb/s physical layer (PHY) transceivers 16 via respective shared media independent interfaces (MII) 18 according to IEEE 802.3u protocol. Each multiport switch 12 also includes a gigabit MAC 24 for sending and receiving data packets to and from a gigabit PHY 26 for transmission to the gigabit node 22 via a high speed network medium 28.

Each 10/100 Mb/s network station 14 sends and receives data packets to and from the corresponding multiport switch 12 via a media 17 and according to either half-duplex or full duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 17. Rather, each half-duplex station 14 includes an Ethernet interface card that uses carrier-sense multiple access with collision detection (CSMA/CD) to listen for traffic on the media. The absence of network traffic is detected by sensing deassertion of a receive carrier on the media. Any station 14 having data to send will attempt to access the channel by waiting a predetermined time, known as the interpacket gap interval (IPG), after deassertion of the receive carrier on the media. If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 10/100 Mb/s network stations 14 that operate in full duplex mode send and receive data packets according to the Ethernet standard IEEE 802.3u. The full-duplex environment provides a two-way, point-to-point communication link enabling simultaneous transmission and reception of data packets between each link partner, i.e., the 10/100 Mb/s network station 14 and the corresponding multiport switch 12.

Each multiport switch 12 is coupled to 10/100 physical layer (PHY) transceivers 16 configured for sending and receiving data packets to and from the corresponding multiport switch 12 across a corresponding shared media independent interface (MII) 18. In particular, each 10/100 PHY transceiver 16 is configured for sending and receiving data packets between the multiport switch 12 and up to four (4) network stations 14 via the shared MII 18. A magnetic transformer 19 provides AC coupling between the PHY transceiver 16 and the corresponding network medium 17. Hence, the shared MII 18 operates at a data rate sufficient to enable simultaneous transmission and reception of data packets by each of the network stations 14 to the corresponding PHY transceiver 16.

Each multiport switch 12 also includes an expansion port 30 for transferring data between other switches according to a prescribed protocol. For example, each expansion port 30 can be implemented as a second gigabit MAC port similar to port 24, thereby enabling multiple multiport switches 12 to be cascaded together as a separate backbone network.

Figure 2:
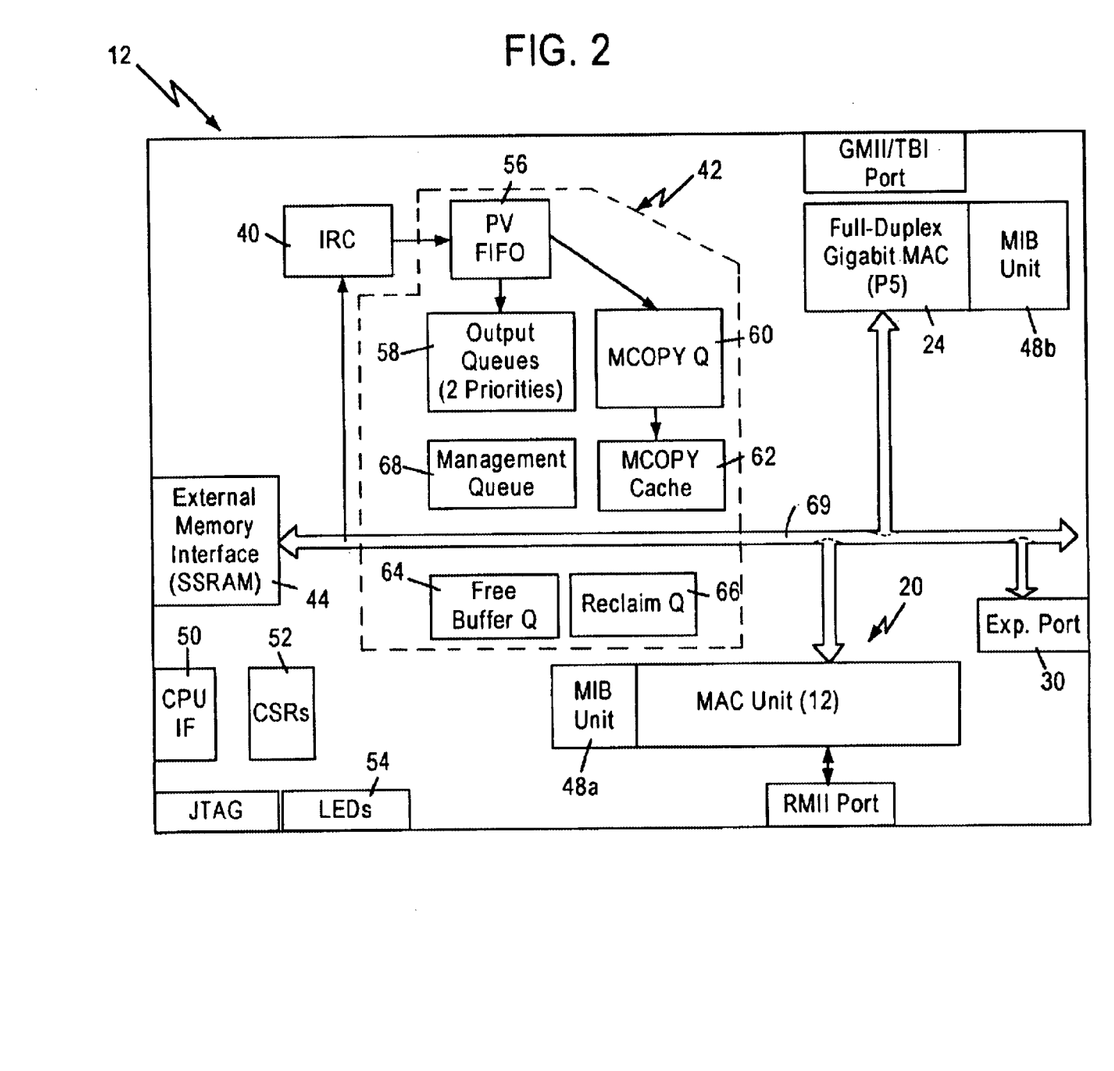
FIG. 2 is a block diagram of the multiple port switch of FIG. 1.

FIG. 2 is a block diagram of the multiport switch 12. The multiport switch 12 contains a decision making engine 40 that performs frame forwarding decisions, a switching subsystem 42 for transferring frame data according to the frame forwarding decisions, an external memory interface 44, management information base (MIB) counters 48a and 48b (collectively 48), and MAC (media access control) protocol interfaces 20 and 24 to support the routing of data packets between the Ethernet (IEEE 802.3) ports serving the network stations 14 and the gigabit mode 22. The MIB counters 48 provide statistical network information in the form of management information base (MIB) objects, to an external management entity controlled by a host CPU 32, described below.

The external memory interface 44 enables external storage of packet data in an external memory 36 such as, for example, a synchronous static random access memory (SSRAM), in order to minimize the chip size of the multiport switch 12. In particular, the multiport switch 12 uses the external memory 36 for storage of received frame data, memory structures, and MIB counter information. The external memory 36 is preferably either a Joint Electron Device Engineering Council (JEDEC) pipelined burst or Zero Bus Turnaround™ (ZBT)-SSRAM having a 64-bit wide data path and a 16-bit wide address path. The external memory 36 is addressable as upper and lower banks of 128K in 64-bit words. The size of the external memory 36 is preferably at least 1 Mbytes, with data transfers possible on every clock cycle through pipelining. Additionally the external memory interface clock operates at clock frequencies of at least 66 MHz, and, preferably, 100 MHz and above.

The multiport switch 12 also includes a processing interface 50 that enables an external management entity such as a host CPU 32 to control overall operations of the multiport switch 12. In particular, the processing interface 50 decodes CPU accesses within a prescribed register access space, and reads and writes configuration and status values to and from configuration and status registers 52.

The internal decision making engine 40, referred to as an internal rules checker (IRC), makes frame forwarding decisions for data packets received from one source to at least one destination station.

The multiport switch 12 also includes an LED interface 54 that clocks out the status of conditions per port and drives an external LED logic. The external LED logic drives LED display elements that are human readable.

The switching subsystem 42, configured for implementing the frame forwarding decisions of the IRC 40, includes a port vector first in first out (FIFO) buffer 56, a plurality of output queues 58, a multicopy queue 60, a multicopy cache 62, a free buffer queue 64, and a reclaim queue 66.

The MAC unit 20 includes modules for each port, each module including a MAC receive portion, a receive FIFO buffer, a transmit FIFO buffer, and a MAC transmit portion. Data packets from a network station 14 are received by the corresponding MAC port and stored in the corresponding receive FIFO. The MAC unit 20 obtains a free buffer location (i.e., a frame pointer) from the free buffer queue 64, and outputs the received data packet from the corresponding receive FIFO to the external memory interface 44 for storage in the external memory 36 at the location specified by the frame pointer.

The IRC 40 monitors (i.e., "snoops") the data bus to determine the frame pointer value and the header information of the received packet (including source, destination, and VLAN address information). The IRC 40 uses the frame pointer value and the associated header information to determine which MAC ports will output the data frame stored at the location specified by the frame pointer. The decision making engine (i.e., the IRC 40) may thus determine that a given data frame should be output by either a single port, multiple ports, or all ports (i.e., broadcast). For example, each data frame includes a header having source and destination address, where the decision making engine 40 may identify the appropriate output MAC port based upon the destination address. Alternatively, the destination address may correspond to a virtual address that the appropriate decision making engine identifies as corresponding to a plurality of network stations. Alternatively, the received data frame may include a VLAN (virtual LAN) tagged frame according to IEEE 802.1d protocol that specifies another network (e.g., via a gateway such as the gigabit mode 22) or a prescribed group of stations. The IRC 40 may also determine that the received data packet should be transferred to another multiport switch 12 via the expansion port 30. Hence, the internal rules checker 40 will decide whether a frame temporarily stored in the external memory 36 should be output to a single MAC port or multiple MAC ports.

The internal rules checker 40 outputs a forwarding decision to the switch subsystem 42 in the form of a forwarding descriptor. The forwarding descriptor includes a priority class identifying whether the frame is high priority or low priority, a port vector identifying each MAC port that should receive the data frame, Rx port number, an untagged set field, VLAN information, opcode, and frame pointer. The port vector identifies the MAC ports to receive the data frame for transmission (e.g., 10/100 MAC ports 1–12, Gigabit MAC port, and/or Expansion port). The port vector FIFO 56 decodes the forwarding descriptor including the port vector, and supplies the frame pointer to the appropriate output queues 58 that correspond to the output MAC ports to receive the data frame transmission. In other words, the port vector FIFO 56 supplies the frame pointer on a per-port basis. The output queues 58 fetch the data frame identified in the port vector from the external memory 36 via the external memory interface 44, and supply the retrieved data frame to the appropriate transmit FIFO of the identified ports. If a data frame is to be supplied to a management agent, the frame pointer is also supplied to a management queue 68, which can be processed by the host CPU 32 via the CPU interface 50.

The multicopy queue 60 and the multicopy cache 62 keep track of the number of copies of the data frame that are fetched from the respective output queues 58, ensuring that the data frame is not overwritten in the external memory 36 until the appropriate number of copies of the data frame have been output from the external memory 36. Once the number of copies output corresponds to the number of ports specified in the port vector FIFO 56, the port vector is forwarded to the reclaim queue 66. The reclaim queue 66 stores frame pointers that can be reclaimed by the free buffer queue 64 as free pointers. After being returned to the free buffer queue 64, the frame pointer is available for reuse by the MAC unit 20 or the gigabit MAC unit 24.

Figures 3, 3A:
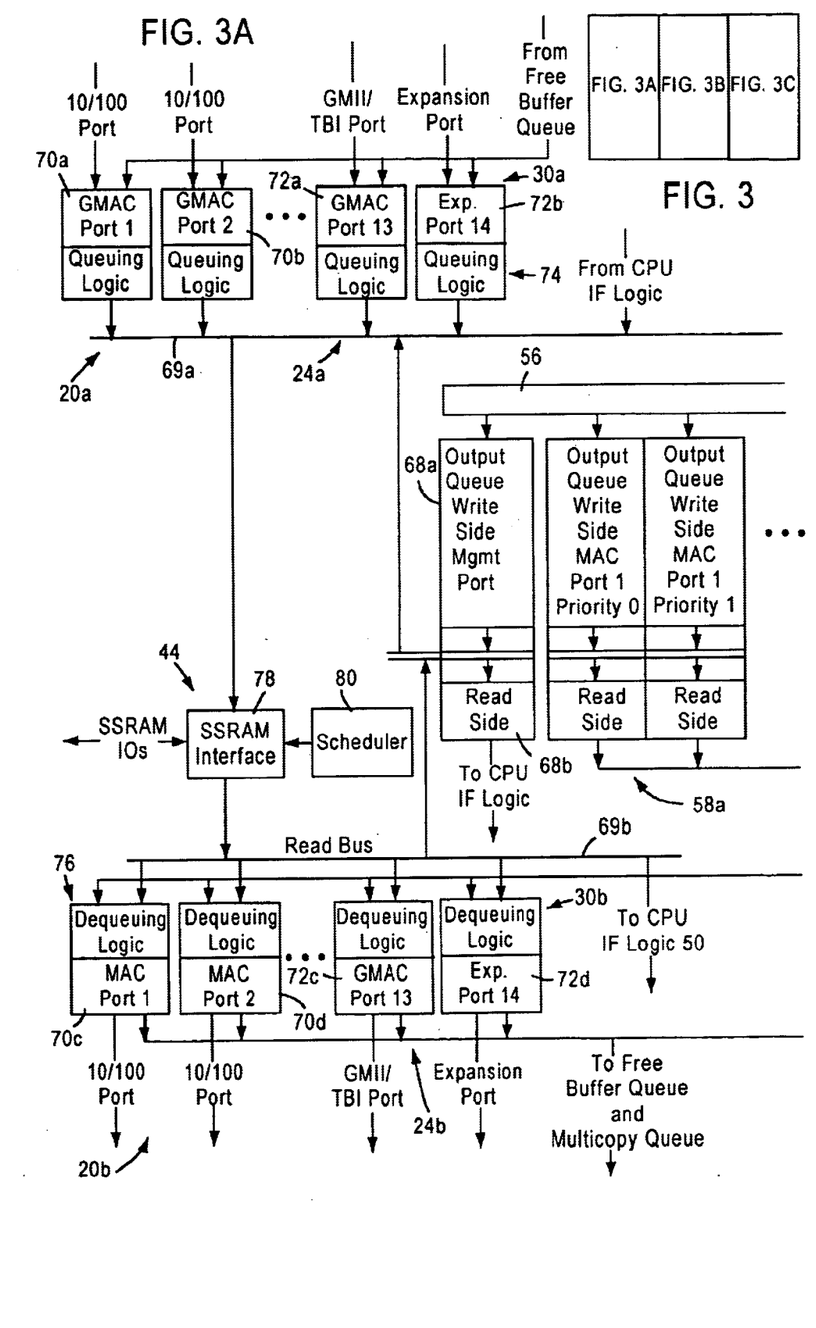
FIG. 3 is a block diagram illustrating in detail the switching subsystem of FIG. 2.
Figure 3B:
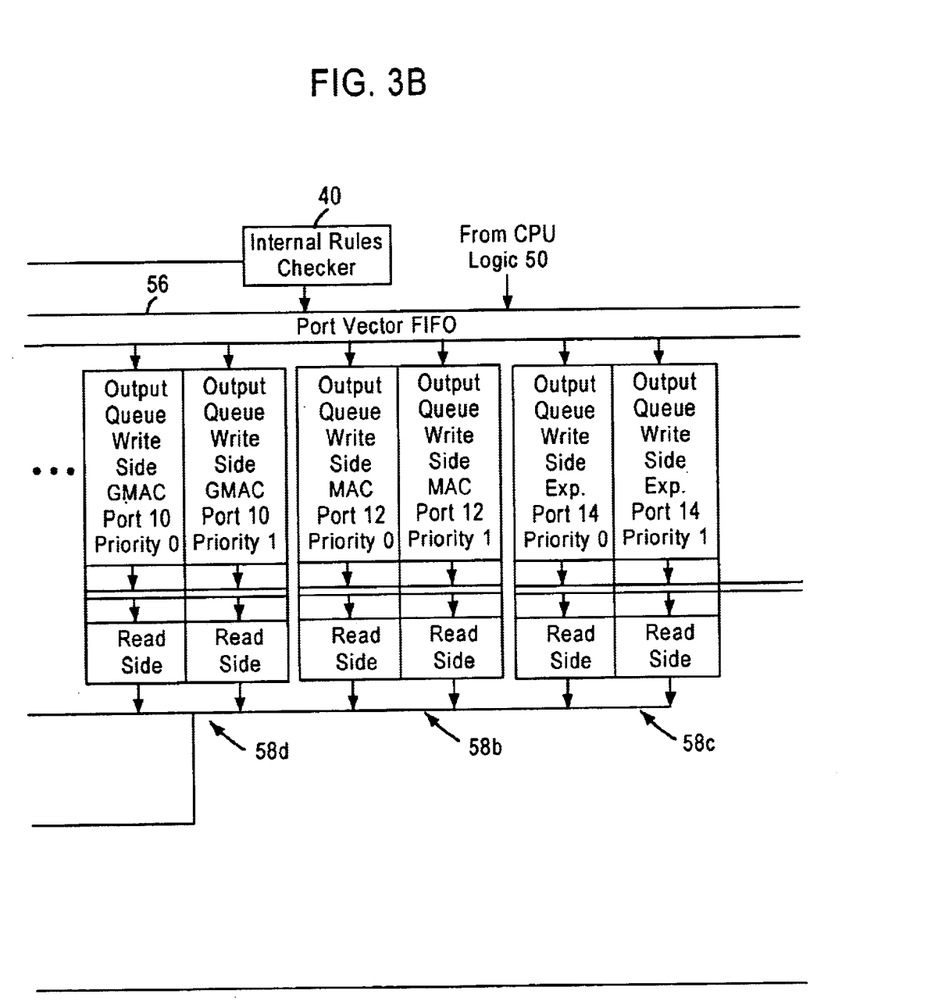
Figure 3C:
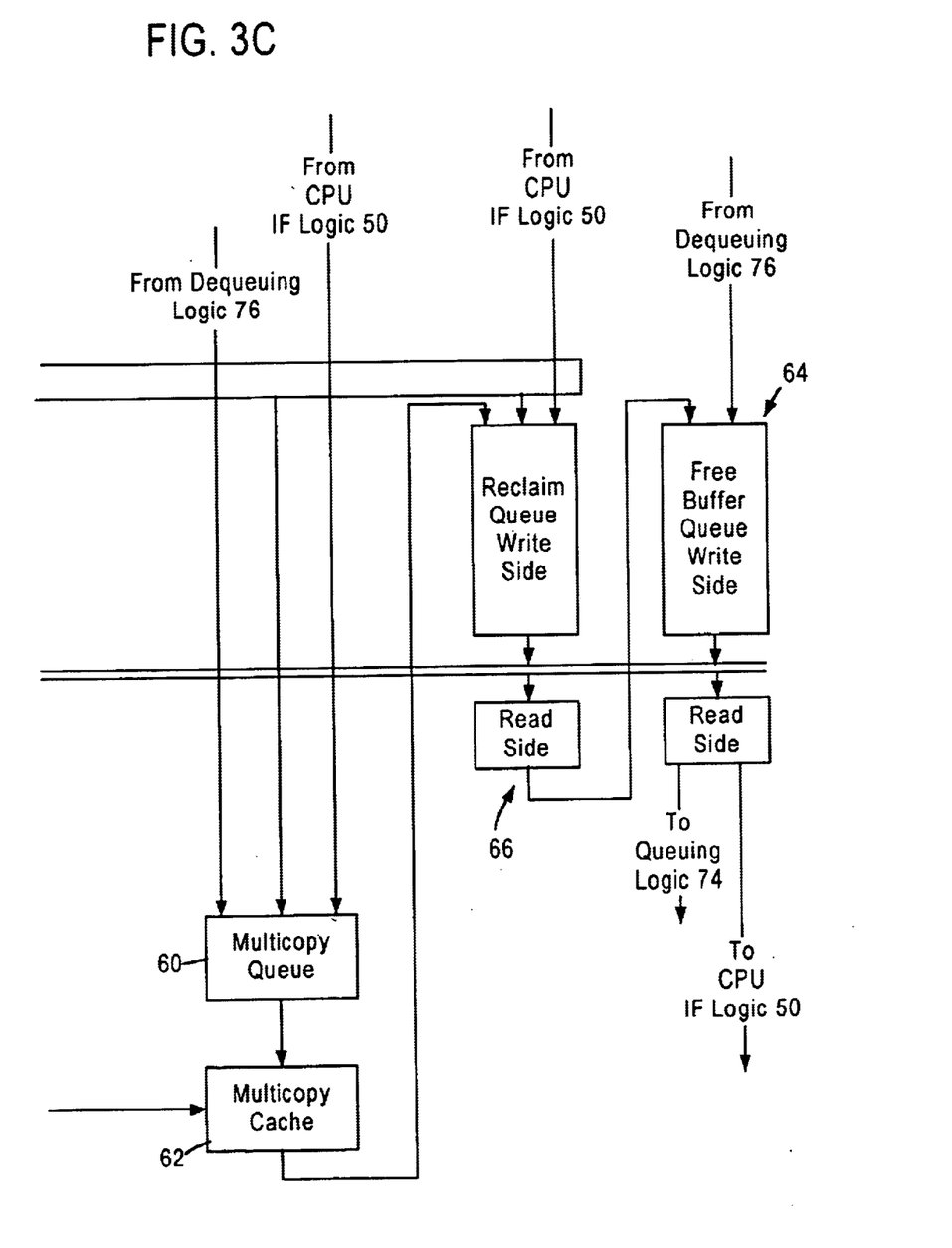

FIG. 3 depicts the switch subsystem 42 of FIG. 2 in more detail according to an exemplary embodiment of the present invention. Other elements of the multiport switch 12 of FIG. 2 are reproduced in FIG. 3 to illustrate the connections of the switch subsystem 42 to these other elements.

As shown in FIG. 3, the MAC module 20 includes a receive portion 20a and a transmit portion 20b. The receive portion 20a and the transmit portion 20b each include four (4) quad-MAC enhanced (QMACE) modules (only two of each shown and referenced by numerals 70a, 70b, 70c, and 70d) configured for performing the corresponding receive or transmit function for four (4) switch ports according to IEEE 802.3 protocol. Hence, QMACE module 70a performs receive MAC operations for 10/100 Mb/s switch ports 0, 1, 2, 3; module 70b performs receive MAC operations for 10/100 Mb/s switch ports 4, 5, 6, 7; etc. The QMACE modules 70c and 70d perform the transmit MAC operations for the 10/100 Mb/s switch ports complementary to modules 70a and 70b, respectively.

The gigabit MAC port 24 also includes a receive portion 24a and a transmit portion 24b, while the expansion port 30 similarly includes a receive portion 30a and a transmit portion 30b. The gigabit MAC port 24 and the expansion port 30 also have receive MAC modules 72a and 72b optimized for the respective ports. The transmit portions 24b and 30b of the gigabit MAC port 24 and the expansion port 30a also have transmit MAC modules 72c and 72d, respectively. The MAC modules are configured for full-duplex operation on the corresponding port, and the gigabit MAC modules 72a and 72c are configured in accordance with the Gigabit Proposed Standard IEEE Draft P802.3z.

Each of the receive MAC modules 70a, 70b, 72a, and 72b include queuing logic 74 for transfer of received data from the corresponding internal receive FIFO to the external memory 36 and the rules checker 40. Each of the transmit MAC modules 70c, 70d, 72c, and 72d includes a dequeuing logic 76 for transferring data from the external memory 36 to the corresponding internal transmit FIFO, and a queuing logic 74 for fetching frame pointers from the free buffer queue 64. The queuing logic 74 uses the fetched frame pointers to store receive data to the external memory 36 via the external memory interface controller 44. The frame buffer pointer specifies the location in the external memory 36 where the received data frame will be stored by the receive FIFO.

The external memory interface 44 includes a scheduler 80 for controlling memory access by the queuing logic 74 or dequeuing logic 76 of any switch port to the external memory 36, and an SSRAM interface 78 for performing the read and write operations with the external memory 36. In particular, the multiport switch 12 is configured to operate as a non-blocking switch, where network data is received and output from the switch ports at the respective wire rates of 10, 100, or 1000 Mb/s. Hence, the scheduler 80 controls the access by different ports to optimize usage of the bandwidth of the external memory 36.

Each receive MAC stores a data frame in an internal FIFO upon reception from the corresponding switch port. The corresponding queuing logic 74 obtains a frame pointer and sends a write request to the external memory interface 44. The scheduler 80 schedules the write request with other write requests from the queuing logic 74 or any read requests from the dequeuing logic 76, and generates a grant for the requesting queuing logic 74 (or the dequeuing logic 76) to initiate a transfer at the scheduled event (i.e., slot). The frame data is then transferred over a write data bus 69a from the receive FIFO to the external memory 36 in a direct memory access (DMA) transaction during the assigned slot based on the retrieved frame pointer. The frame data is stored in the location pointed to by the free buffer pointer obtained from the free buffer pool 64, although a number of other buffers may be used to store data frames, as will be described.

The rules checker 40 also receives the frame pointer and the header information (including source address, destination address, VLAN tag information, etc.) by monitoring (i.e., snooping) the DMA write transfer on the write data bus 69a. The rules checker 40 uses the header information to make the forwarding decision and generate a forwarding instruction in the form of a forwarding descriptor that includes a port vector. The port vector has a bit set for each output port to which the frame should be forwarded. If the received frame is a unicopy frame, only one bit is set in the port vector generated by the rules checker 40. The single bit that is set in the port vector corresponds to a particular one of the ports.

The rules checker 40 outputs the forwarding descriptor including the port vector and the frame pointer into the port vector FIFO 56. The port vector is examined by the port vector FIFO 56 to determine which particular output queue, e.g., at least one of the output queues 58 or the management queue 68, should receive the associated frame pointer. The port vector FIFO 56 places the frame pointer into the top of the appropriate queue 58 and/or 68. This queues the transmission of the frame. Each output queue 58 is processed separately by the host CPU 32 via the CPU interface 50.

As shown in FIG. 3, each of the transmit MAC units 70c, 70d, 72d, and 72c has an associated output queue 58a, 58b, 58c, and 58d, respectively. Although not shown in FIG. 3, in preferred embodiments each of the output queues 58 has a high priority queue for high priority frame pointers, and a low priority queue for low priority frame pointers. The high priority frame pointers are used for data frames that require a guaranteed access latency, e.g., frames for multimedia applications or management MAC frames. The frame pointers stored in the FIFO-type output queues 58 are processed by the dequeuing logic 76 for the respective transmit MAC units. At some point in time, the frame pointer reaches the bottom of an output queue 58, for example, output queue 58d for the gigabit transmit MAC 72c. The dequeuing logic 76 for the transmit gigabit port 24b takes the frame pointer from the corresponding gigabit port output queue 58d, and issues a request to the scheduler 80 to read the frame data from the external memory 36 at the memory location specified by the frame pointer. The scheduler 80 schedules the request, and issues a grant for the dequeuing logic 76 of the transmit gigabit port 24b to initiate a DMA read during the assigned slot. In response to the grant, the dequeuing logic 76 reads the frame data (along the read bus 69b) in a DMA transaction from the location in external memory 36 pointed to by the frame pointer, and stores the frame data in the internal transmit FIFO for transmission by the transmit gigabit MAC 72c. If the frame pointer specifies a unicopy transmission, the frame pointer is returned to the free buffer queue 64 following writing the frame data into the transmit FIFO.

A multicopy transmission is similar to the unicopy transmission, except that the port vector has multiple bits set, designating the multiple ports from which the data frame will be transmitted. The frame pointer is placed into each of the appropriate output queues 58 and transmitted by the appropriate transmit MAC units 20b, 24b, and/or 30b.

The free buffer pool 64, the multicopy queue 60, the reclaim queue 66, and the multicopy cache 62 are used to manage use of frame pointers and re-use of frame pointers once the data frame has been transmitted to its designated output port(s). In particular, the dequeuing logic 76 passes frame pointers for unicopy frames to the free buffer queue 64 after the buffer contents have been copied to the appropriate transmit FIFO.

For multicopy frames, the port vector FIFO 56 supplies multiple copies of the same frame pointer to more than one output queue 58, each frame pointer having a unicopy bit set to zero. The port vector FIFO 56 also copies the frame pointer and the copy count to the multicopy queue 60. The multicopy queue 60 writes the copy count to the multicopy cache 62. The multicopy cache 62 is a random access memory having a single copy count for each buffer in external memory 36 (i.e., each frame pointer).

Once the dequeuing logic 76 retrieves the frame data for a particular output port based on a fetched frame pointer and stores the frame data in the transmit FIFO, the dequeuing logic 76 checks if the unicopy bit is set to 1. If the unicopy bit is set to 1, the frame pointer is returned to the free buffer queue 64. If the unicopy bit is set to zero indicating a multicopy frame pointer, the dequeuing logic 76 writes the frame pointer with a copy count of minus one (−1) to the multicopy queue 60. The multicopy queue 60 adds the copy count to the entry stored in the multicopy cache 62.

When the copy count in multicopy cache 62 for the frame pointer reaches zero, the frame pointer is passed to the reclaim queue 66. Since a plurality of frame pointers may be used to store a single data frame in multiple buffer memory locations, the frame pointers are referenced to each other to form a linked-list (i.e., chain) of frame pointers to identify the stored data frame in its entirety. The reclaim queue 66 traverses the chain of buffer locations identified by the frame pointers, and passes the frame pointers to the free buffer queue 64.

The foregoing description of the switch architecture provides an overview of the switch operations in a packet switched network. A more detailed description of the features of the present invention as embodied in the multiport switch 12 will now be provided.

Modifying Switch Digital Registers without Code Change

The present invention is directed to modifying the digital registers associated with the many functionalities of a multiport switch 12 without changing the source code. Because of the complexity of the multiport switch 12, a design tool for digital hardware simulation is required to implement the breadth of functions as described previously. In an exemplary embodiment, one such tool is a hardware description language (HDL), which allows the designer to describe a component in textual form rather than with a schematic diagram. In the preferred embodiment, the hardware description language is Verilog, which is an IEEE standard 1364. In the alternative, the other industry standard hardware description language is VHDL (Very High Speed Integrated Circuit Hardware Description Language). VHDL is IEEE standard 1076. The present invention focuses on streamlining the design of digital registers within the multiport switch 12. Accordingly, savings in design costs are realized.

Figure 4A:
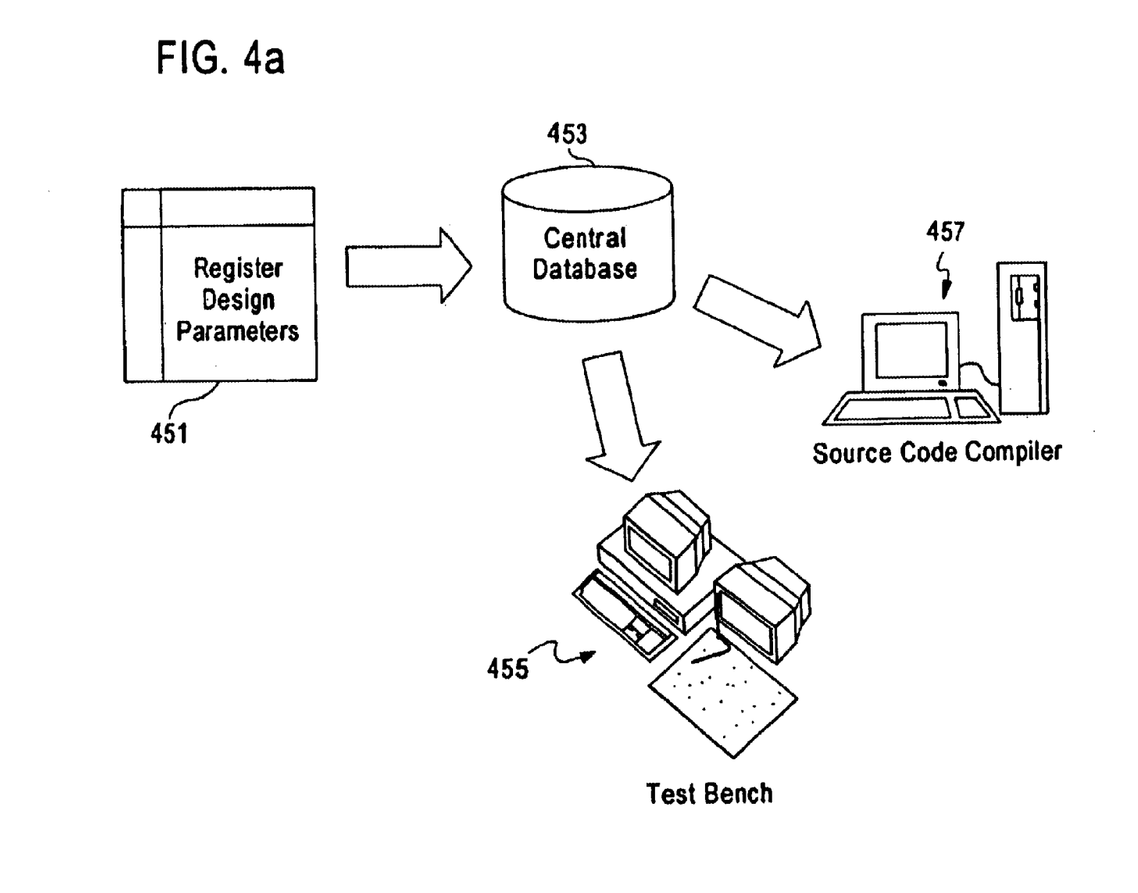
FIGS. 4a and 4b are block diagrams of a system including the central database and source code compiler in accordance with an embodiment of the present invention and associated flow diagram, respectively.

FIG. 4a shows certain key components involved in the design of digital registers within the multiport switch 12. Design parameters associated with digital registers include the bit definition and bit default values. For example, the IRC 40 uses priority mapping registers; these registers are 16 bits in length, in which bits 0 through 7 denote the user priority mapping and bits 8 through 15 are reserved. In addition, the user priority mapping bits have a default value of 00H. The reserve bits 8 through 15 have a default value of 0. The user priority mapping register bit definition table is shown below.

| Bit(s) | Name | Description | Default | Bit Type |
| --- | --- | --- | --- | --- |
| 15–8 | RES | Reserved (writes are ignored; reads return 0) | 0 | RO |
| 7–0 | USRPTY | User Priority Mapping: The IRC compares the User Priority extracted from the received VLAN TCI field and maps the frame onto the High or Low Priority Class Output Queue when forwarding the frame. Bit 7 of this register represents User Priority 7; Bit 0 of this register represents User Priority 0.<br>1 = High Priority Class Output Queue for the User Priority<br>0 = Low Priority Class Output Queue for the User Priority | 00H | RW |

These design parameters are contained, in one embodiment, within a functional product specification 451. This document 451 details all the design criteria regarding the multiport switch 12. As seen in FIG. 4a, the register design parameters in the document 451 is input into a central database 453, which stores these design parameters in its table entries. The source code compiler 457, which in the preferred embodiment is Verilog, automatically retrieves the design parameters from the central database 453. The central database 453 has a capability to export an ASCII (American Standard Code for Information Interchange) formatted file to the source code compiler 457. Further, the central database 453 is a commercial off-the-shelf (COTS) application having database functionality or, in the alternative, a spread sheet functionality. The source code compiler 457 populates the pertinent source code variables associated with the digital registers with the register design parameters. Furthermore, a test bench 455 retrieves the register design parameters from the central database 453 to generate a series of test cases. In a true design environment, compiler 457 supports a hardware design team; and the test bench 455 is controlled by a test and evaluation team. Although only two teams are mentioned, it is apparent that the present invention is applicable to any number of teams that are required to develop and test the switch 12.

These two teams often modify the register design parameters without alerting the other team. Consequently, mismatch in design can occur in conventional arrangements (e.g., shown in FIG. 5), resulting in erroneous implementation of the digital registers; thereby, causing improper operation of the multiport switch 12. However, the present invention contemplates the use of a central database 453 to manage and update the design parameters in order to uniformly provide both the test bench 455 and the source code compiler 457 with the latest register design parameters.

In one embodiment, the central database 453 resides in a server (not shown), which is connected in a local area network (not shown) such that the design parameters can be readily updated on a real-time basis. That is, any time a team wishes to change one of the design parameters with respect to the digital registers, it may do so by updating the central database 453 via a local area network such that the design information is updated nearly instantly. Under this arrangement, the other design teams would have access to the latest design parameters. As a result, the problem of design mismatch is greatly diminished. The operation of the central database 453 is now described in more detail with respect to FIG. 4b.

Figure 4B:
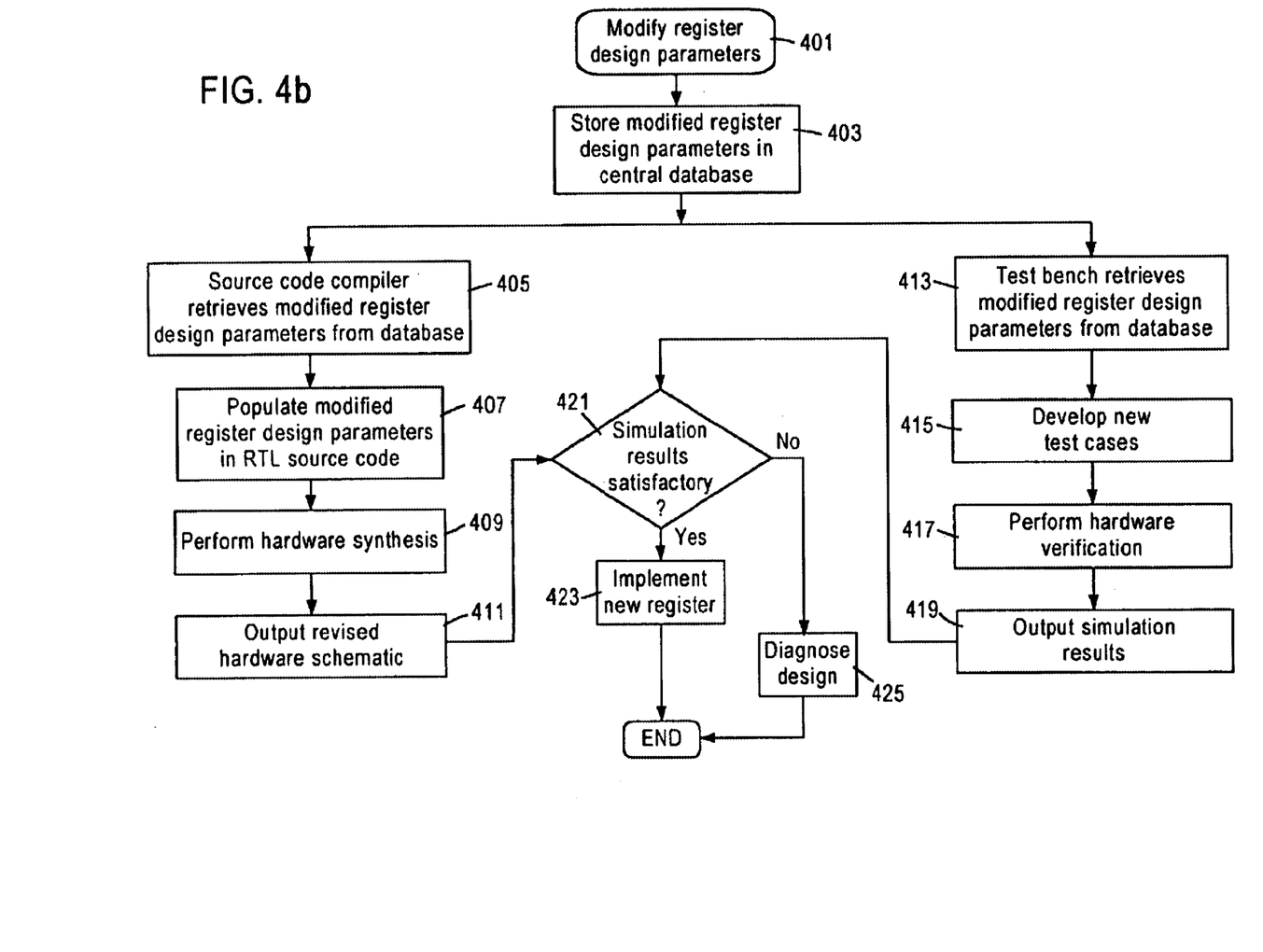

FIG. 4b shows a flow diagram of a method and system of modifying the register design parameters without altering the source code, in accordance with an embodiment of the present invention. As the design of the multiport switch 12 progresses, invariably design changes with respect to the digital registers are necessary to optimize the operation of the switch 12. The illustration in FIG. 4b provides an example of two separate teams utilizing the register design parameters that are captured in a technical document 451. It is evident, however, that this method can be applied across numerous other teams that require access to the register design parameters.

For the purposes of explanation, it will be assumed that a hardware design team in charge of the source code compiler 457 desires to change a register design parameter—perhaps to reduce the size of a register. In step 401 this design team recognizes that it has to modify one of the design parameters; for example, a default value of one of the bits is changed. Accordingly, this change is entered in the technical document 451, and is then stored as in step 403 in the central database 453. In contrast, the conventional approach of FIG. 5 does not involve storage of the design change in a database that is employed as part of the design process. In one embodiment of the present invention, central database 453 is a relational database in which a table entry includes the bit definition and bit default values corresponding to each of the digital registers that require change. In step 405 the source compiler 457 retrieves the modified register design parameters from the central database 453 in one of two related ways. The first method entails the central database 453 exporting the table entries in an ASCII formatted file to the source compiler 457. In the alternative, the source code compiler 457 automatically retrieves the information by importing the table entries of the central database 453 as an ASCII file.

Once the source compiler 457 retrieves the modified design parameters, the source code compiler 457, in step 407, populates the modified register design parameters in the RTL source code. That is, the source code compiler 457 initializes and defines the corresponding code variables within the source code with the retrieved information. As previously mentioned, RTL code is a hardware description language that specifies the functions of the digital registers used in the multiport switch 12. It should be observed that the population of the modified register design parameters within the source code does not alter the source code, but only initializes any necessary variables. As a result, this advantageously admits the updating of the design of the digital registers without costly rewriting of code. Under the conventional approach (FIG. 5), the hardware design team would manually update the source code, which is an inefficient and error prone undertaking. In step 409, the source code compiler 457 performs hardware synthesis of the source code; in this step, the source code is converted by the source code compiler 457 into a hardware schematic (step 411).

Concurrent with the hardware design team's use of the source compiler 457 to design the hardware schematic that reflects the modified design parameters, a test and evaluation team also utilizes the modified design parameters stored in central database 453 to conduct its testing and verification. Test bench 455, in step 413, retrieves the modified register design from the central database 453 via an ASCII formatted file transfer. This is in contrast with the conventional approach, which entails a manual entry process to implement the changes in design parameters. The modified register design is used, as in step 415, to develop new test cases, which seek to test all the functions of the corresponding digital registers in an operation mode within the multiport switch 12. The next step 417 involves the test and evaluation team performing hardware verification of the digital registers.

This step of hardware verification 417 ensures that the digital registers that were modified are operating correctly. In turn, the test bench 453 runs a series of simulations and outputs the simulation results per set 419. In step 421 the simulation results are examined to determine whether they are satisfactory; that is, the modified digital registers are operating within the multiport switch 12 according to pre-established design criteria. In the event that the simulation results fall outside the established criteria, the modified digital registers are not implemented and diagnosis has to be performed by the test and evaluation team per step 425 to determine where the error occurred. However, if the simulation results are satisfactory, the digital registers as modified are implemented per step 423. An advantage of the present invention is that design mismatch problems are virtually eliminated. Another advantage is that each design team does not need to manually alter the source code because the respective subsystems may retrieve the information automatically from the central database 457, thereby reducing the chances of errors introduced by the manual entry process.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method for modifying design of a digital register in a network switch comprising:

modifying design parameters associated with the digital register, the design parameters including bit definition and bit default values;

centrally storing the modified design parameters in a central database;

retrieving the modified design parameters from the central database into a source code that specifies functionality of the digital register within the network switch to initialize and define corresponding code variables within the source code;

performing hardware synthesis based upon the modified design parameters;

performing hardware verification based upon the modified design parameters; and implementing the modified digital register in the network switch.

2. The method as in claim 1, wherein the step of performing hardware synthesis comprises outputting a hardware schematic based upon the modified design parameters, and the step of implementing is in accordance with the hardware schematic.

3. The method as in claim 1, wherein the step of performing hardware verification comprises:

developing test cases for testing the functionality and operation of the digital register within the network switch based upon the modified design parameters;

executing the test cases; and outputting simulation results of the digital register operating within the network switch in response to the executing step.

4. The method as in claim 1, wherein the step of retrieving comprises importing the modified design parameters as an ASCII formatted file.

5. The method as in claim 1, wherein the step of performing hardware synthesis and the source code conform with IEEE standard 1364.

6. The method as in claim 1, wherein the step of performing hardware synthesis is at a register transfer level (RTL).

7. The method as in claim 1, wherein the step of centrally storing is performed by a commercial off-the-shelf (COTS) application having database functionality.

8. The method as in claim 7, wherein the step of centrally storing is performed by the commercial off-the-shelf (COTS) application having a capability to export in ASCII format.

9. The method as in claim 1, wherein the steps of modifying, centrally storing, and retrieving are performed on a real-time basis.

10. A system for modifying design of digital registers of a network switch comprising:

a centralized data storage system for storing and updating a register table that comprises a plurality of entries associated with the digital registers, each of the register table entries including bit definition and bit default values corresponding to each of the digital registers;

a source code compiler having hardware modeling capability configured for importing entries from the centralized data storage system and initializing and defining corresponding code variables, and outputting a hardware schematic diagram of the digital register; and a testing device for concurrently testing operation and functionality of the digital registers based upon the register table entries.

11. The system as in claim 10, wherein the centralized data storage system has a capability to export the table entries as an ASCII formatted file.

12. The system as in claim 10, wherein the centralized data storage system provides real-time updating capability.

13. The system as in claim 10, wherein the centralized data storage system is a commercial off-the-shelf (COTS) system.

14. The system as in claim 10, wherein the testing device is configured for developing test cases and outputting simulation results of the digital registers operating within the network switch.

15. The system as in claim 10, wherein the source code compiler conforms with IEEE standard 1364.

16. The system as in claim 10, wherein the source code compiler compiles at a register transfer level (RTL).

17. A system for modifying design of digital registers of a network switch comprising:

a central database for storing modified design parameters associated with the digital registers;

a source code compiler for retrieving the modified design parameters and utilizing the design parameters in a first procedure; and a testing device for retrieving the modified design parameters and utilizing the modified design parameters in a second procedure wherein said testing device for concurrently testing operations and functionality of the digital registers.

18. The system as in claim 17, further comprising a data entry system for updating the stored design parameters in the central database to effectively update the design parameters used in the first procedure and the second procedure.

19. The system as in claim 18, wherein the data entry system comprises a computer communicating over a local area network, the central database being accessible via the local area network.

20. The system as in claim 17, wherein the first procedure comprises performing hardware synthesis based upon the design parameters, and the second procedure comprises performing hardware verification based upon the design parameters.

* * * * *